(12) United States Patent
Rajski et al.

(10) Patent No.: US 7,093,175 B2
(45) Date of Patent: *Aug. 15, 2006

(54) DECOMPRESSOR/PRPG FOR APPLYING PSEUDO-RANDOM AND DETERMINISTIC TEST PATTERNS

(76) Inventors: Janusz Rajski, 6502 Horton Rd., West Linn, OR (US) 97068; Jerzy Tyszer, Os. Stare Zegrze 89C/2, 61-249 Poznan (PL); Mark Kassab, 29665 SW. Rose La., Apartment 288, Wilsonville, OR (US) 97070; Nilanjan Mukherjee, 29290 SW. Parkway Ct., Apartment 92, Wilsonville, OR (US) 97070

( * ) Notice: Subject to any disclaimer, the term of this patent is extended or adjusted under 35 U.S.C. 154(b) by 0 days.

This patent is subject to a terminal disclaimer.

(21) Appl. No.: 10/736,966

(22) Filed: Dec. 15, 2003

(65) Prior Publication Data

US 2004/0128599 A1    Jul. 1, 2004

Related U.S. Application Data

(63) Continuation of application No. 09/713,664, filed on Nov. 15, 2000, now Pat. No. 6,684,358.

(60) Provisional application No. 60/167,137, filed on Nov. 23, 1999.

(51) Int. Cl.
*G01R 31/28* (2006.01)
(52) U.S. Cl. .................. 714/728; 714/739; 714/729
(58) Field of Classification Search ................ 714/739, 714/733, 738, 732, 728, 727, 703, 736, 724, 714/726, 742; 712/227; 324/158.1
See application file for complete search history.

(56) References Cited

U.S. PATENT DOCUMENTS

| 3,614,400 A | 10/1971 | Farnett |
| 3,700,869 A | 10/1972 | Low et al. |
| 4,503,537 A | 3/1985 | McAnney |
| 4,513,418 A | 4/1985 | Bardell, Jr. et al. |
| 4,536,881 A | 8/1985 | Kasuya |
| 4,602,210 A | 7/1986 | Fasang et al. |

(Continued)

FOREIGN PATENT DOCUMENTS

EP    0372226    6/1990

(Continued)

OTHER PUBLICATIONS

U.S. Appl. No. 09/619,985, filed Jul. 20, 2000, Rajski et al.

(Continued)

*Primary Examiner*—Albert Decady
*Assistant Examiner*—Mujtaba Chaudry
(74) *Attorney, Agent, or Firm*—Klarquist Sparkman, LLP

(57) ABSTRACT

A novel decompressor/PRPG on a microchip performs both pseudo-random test pattern generation and decompression of deterministic test patterns for a circuit-under-test on the chip. The decompressor/PRPG has two phases of operation. In a pseudo-random phase, the decompressor/PRPG generates pseudo-random test patterns that are applied to scan chains within the circuit-under test. In a deterministic phase, compressed deterministic test patterns from an external tester are applied to the decompressor/PRPG. The patterns are decompressed as they are clocked through the decompressor/PRPG into the scan chains. The decompressor/PRPG thus provides much better fault coverage than a simple PRPG, but without the cost of a complete set of fully-specified deterministic test patterns.

12 Claims, 10 Drawing Sheets

U.S. PATENT DOCUMENTS

| | | | |
|---|---|---|---|
| 4,687,988 | A | 8/1987 | Eichelberger et al. |
| 4,754,215 | A | 6/1988 | Kawai |
| 4,785,410 | A | 11/1988 | Hamatsu et al. |
| 4,801,870 | A | 1/1989 | Eichelberger et al. |
| 4,860,236 | A | 8/1989 | McLeod et al. |
| 4,959,832 | A | 9/1990 | Bardell, Jr. |
| 4,974,184 | A | 11/1990 | Avra |
| 5,090,035 | A | 2/1992 | Murase |
| 5,138,619 | A | 8/1992 | Fasang et al. |
| 5,167,034 | A | 11/1992 | MacLean, Jr. et al. |
| 5,173,906 | A | 12/1992 | Dreibelbis et al. |
| 5,202,889 | A * | 4/1993 | Aharon et al. ............... 714/739 |
| 5,258,986 | A | 11/1993 | Zerbe |
| 5,268,949 | A | 12/1993 | Watanabe |
| 5,301,199 | A | 4/1994 | Ikenaga et al. |
| 5,325,367 | A | 6/1994 | Dekker et al. |
| 5,349,587 | A | 9/1994 | Nadeau-Dostie et al. |
| 5,369,648 | A | 11/1994 | Nelson |
| 5,394,405 | A | 2/1995 | Savir |
| 5,412,665 | A | 5/1995 | Gruodis et al. |
| 5,414,716 | A | 5/1995 | Bershteyn |
| 5,416,783 | A | 5/1995 | Broseghini et al. |
| 5,446,683 | A | 8/1995 | Mullen et al. |
| 5,450,414 | A | 9/1995 | Lin |
| 5,524,114 | A | 6/1996 | Peng |
| 5,574,733 | A | 11/1996 | Kim |
| 5,586,125 | A | 12/1996 | Warner |
| 5,592,493 | A | 1/1997 | Crouch et al. |
| 5,612,963 | A | 3/1997 | Koenemann et al. |
| 5,614,838 | A | 3/1997 | Jaber et al. |
| 5,617,179 | A | 4/1997 | Crouch et al. |
| 5,631,913 | A | 5/1997 | Maeda |
| 5,680,543 | A | 10/1997 | Bhawmik |
| 5,694,402 | A | 12/1997 | Butler et al. |
| 5,701,308 | A | 12/1997 | Attaway et al. |
| 5,717,702 | A | 2/1998 | Stokes et al. |
| 5,719,913 | A | 2/1998 | Maeno |
| 5,748,497 | A | 5/1998 | Scott et al. |
| 5,790,562 | A * | 8/1998 | Murray et al. ............... 714/732 |
| 5,790,626 | A | 8/1998 | Johnson et al. |
| 5,812,561 | A | 9/1998 | Giles et al. |
| 5,831,992 | A * | 11/1998 | Wu ............................ 714/732 |
| 5,867,507 | A | 2/1999 | Beebe et al. |
| 5,870,476 | A | 2/1999 | Fischer |
| 5,872,793 | A | 2/1999 | Attaway et al. |
| 5,883,906 | A | 3/1999 | Turnquist et al. |
| 5,899,961 | A | 5/1999 | Sundermann |
| 5,905,986 | A | 5/1999 | Rohrbaugh et al. |
| 5,938,784 | A | 8/1999 | Kim |
| 5,974,179 | A | 10/1999 | Caklovic |
| 5,974,433 | A | 10/1999 | Currie |
| 5,983,380 | A * | 11/1999 | Motika et al. ............... 714/733 |
| 5,991,898 | A | 11/1999 | Rajski et al. |
| 5,991,909 | A | 11/1999 | Rajski et al. |
| 6,006,349 | A | 12/1999 | Fujisaki |
| 6,014,763 | A | 1/2000 | Dhong et al. |
| 6,026,508 | A | 2/2000 | Craft |
| 6,041,429 | A * | 3/2000 | Koenemann ................ 714/738 |
| 6,055,658 | A | 4/2000 | Jaber et al. |
| 6,061,818 | A | 5/2000 | Touba et al. |
| 6,072,823 | A | 6/2000 | Takakusaki |
| 6,122,761 | A | 9/2000 | Park |
| 6,141,669 | A | 10/2000 | Carleton |
| 6,158,032 | A | 12/2000 | Currier et al. |
| 6,178,532 | B1 | 1/2001 | Pierce et al. |
| 6,199,182 | B1 | 3/2001 | Whetsel |
| 6,240,432 | B1 | 5/2001 | Chuang et al. |
| 6,256,759 | B1 | 7/2001 | Bhawmik et al. |
| 6,286,119 | B1 | 9/2001 | Wu et al. |
| 6,300,885 | B1 | 10/2001 | Davenport et al. |
| 6,327,687 | B1 | 12/2001 | Rajski et al. |
| 6,330,681 | B1 | 12/2001 | Cote et al. |
| 6,353,842 | B1 | 3/2002 | Rajski et al. |
| 6,385,750 | B1 | 5/2002 | Kapur et al. |
| 6,539,409 | B1 | 3/2003 | Rajski et al. |
| 6,543,020 | B1 | 4/2003 | Rajski et al. |
| 6,557,129 | B1 | 4/2003 | Rajski et al. |
| 6,684,358 | B1 * | 1/2004 | Rajski et al. ............... 714/739 |
| 6,708,192 | B1 | 3/2004 | Rajski et al. |
| 6,829,740 | B1 | 12/2004 | Rajski et al. |
| 6,874,109 | B1 | 3/2005 | Rajski et al. |
| 2002/0112199 | A1 | 8/2002 | Whetsel |
| 2002/0124217 | A1 | 9/2002 | Hiraide et al. |
| 2003/0120988 | A1 | 6/2003 | Rajski et al. |
| 2003/0131298 | A1 | 7/2003 | Rajski et al. |
| 2004/0172431 | A1 | 9/2004 | Rajski et al. |
| 2005/0015688 | A1 | 1/2005 | Rajski et al. |
| 2005/0097419 | A1 | 5/2005 | Rajski et al. |

FOREIGN PATENT DOCUMENTS

| | | |
|---|---|---|
| EP | 0438322 | 7/1991 |
| EP | 0481097 | 4/1992 |
| EP | 0887930 | 12/1998 |
| JP | 01-239486 | 9/1989 |
| JP | 03-002579 | 1/1991 |
| JP | 4-236378 | 8/1992 |
| JP | 05-215816 | 8/1993 |
| JP | 9-130378 | 5/1997 |
| JP | 11-030646 | 2/1999 |
| JP | 11-153655 | 6/1999 |
| WO | WO 01/38889 | 5/2001 |
| WO | WO 01/39254 | 5/2001 |

OTHER PUBLICATIONS

U.S. Appl. No. 09/619,988, filed Jul. 20, 2000, Rajski et al.
U.S. Appl. No. 09/620,021, filed Jul. 20, 2000, Rajski et al.
U.S. Appl. No. 09/620,023, filed Jul. 20, 2000, Rajski et al.
U.S. Appl. No. 09/713,662, filed Nov. 15, 2000, Rajski et al.
Wang, "BIST Using Pseudorandom Test Vectors and Signature Analysis," *IEEE Custom Integrated Circuits Conference*, pp. 1611-1618 (1998).
Bardell et al., Built in test for VLSI: Pseudorandom Techniques, John Wiley & Sons, 1987.
Bardell et al., "Pseudorandom arrays for built-in tests," ISSS Trans. Comput., vol. C-35, No. 7, pp. 653-658, 1986.
Bardell, "Design Considerations for Parallel Pseudorandom Pattern Generators", Journal of Electronic Testing: Theory and Applications, 1, 73-87 (1990).
Bassett et al., "Low-Cost Testing of High-Density Logic Components," *IEEE Design & Test of Computers*, pp. 15-28 (Apr. 1990).
Bershteyn, "Calculation of Multiple Sets of Weights for Weighted Random Testing," International Test Conference 1993, Paper 45.3, pp. 1031-1040.
Chakrabarty et al., "Optimal space compaction of test responses," *Proc. ITC*, pp. 834-843, 1995.
Chakrabarty et al., "Test response compaction using multiplexed parity trees." *IEEE Transactions CAD of Integrated Circuits and Systems*, vol. CAD-15, No. 11, pp. 1399-1408, 1996.
Fagot et al., "On Calculating Efficient LFSR Seeds for Built-In Self Test," *IEEE*, pp. 7-14 (1999).
Frohwerk, "Signature analysis: a new digital field services method," *Hewlett-Packard Journal*, pp. 2-8, May 1997.
Golomb, Shift Register Sequences, Holden Day, San Francisco, 1967.
Hamzaoglu et al., "Reducing Test Application Time for Full Scan Embedded Cores," Center for Reliable & High-Performance Computing, University of Illinois, Urbana, IL., 1999 IEEE.
Hayes, "Check sum test methods," *Proc. FTCS*, pp. 114-120, 1976.
Hayes, "Transition count testing of combinational logic circuits," *IEEE Trans. Comput.*, vol. C-25, No. 6, pp. 613-620, 1976.
Hellebrand et al., "Built-in Test for Circuits With Scan Based on Reseeding of Multiple Polynomial Linear Feedback Shift Registers", *IEEE Trans. On Computers*, vol. C-44, pp. 223-233, 1995.

Hellebrand et al., "Generation of Vector Patterns Through Reseeding of Multiple-Polynomial Linear Feedback Shift Registers," *IEEE International Test Conference*, pp. 120-129 (1992).
Hellebrand et al., "Pattern Generation for a Deterministic BIST Scheme", pp. 88-94 (1995) IEEE.
Hetherington et al., "Logic BIST for Large Industrial Designs: Real Issues and Case Studies," *Proc. ITC*, pp. 358-367, 1999.
Ireland et al., "Matrix method to determine shaft-register connections for delayed pseudorandom binary sequences," *Electronics Letters*, vol. 4, No. 15, pp. 309-310, 1968.
Ishida et al., "COMPACT: A hybrid method for compressing test data," *Proc. VLSI Test Symposium*, pp. 62-69, 1998.
Ivanov et al., "Programmable BIST space compactors," *IEEE Trans. Comput.*, vol. C-45, No. 12, pp. 1393-1404, 1996.
Iyengar et al., "Built-In Self-testing of sequential circuits using precomputed test sets," *Proc. VLSI Test Symposium*, pp. 418-423, 1998.
Jas et al., "Scan vector compression/decompression using statistical coding," Proc. VLSI Test Symposium, pp. 114-120, 1999.
Jas et al., "Test vector decompression via cyclical scan chains and its application to testing core-based designs," Proc. ITC, pp. 458-464, 1998.
Jone et al., "Space compression method for built-in self testing of VLSI circuits," *Int. Journal of Computer Aided VLSI Design*, vol. 3, pp. 309-322, 1991.
Kapur et al., "Design of an efficient weighted random pattern generation system," *Proc. ITC.*, pp. 491-500, 1994.
Kim et al., "On using signature registers as pseudorandom pattern generators in built-in self testing," *IEEE Trans. CAD of IC*, vol. CAD-7, No. 8, 1988, pp. 919-928.
Koenemann c/o IBM Corp. , B56/901, "LFSR-Coded Test Patterns for Scan Designs", *Proceedings of European Test Conference*, pp. 237-242, 1991.
Langdon, Jr., "An Introduction to Arithmetic Coding," *IBM J. Res. Develop.*, vol. 28, No. 2, pp. 135-149 (Mar. 1984).
Latawiec, "New method of generation of shifted linear pseudorandom binary sequences", *Proc. IEE*, vol. 121, No. 8, pp. 905-906, 1974.
Li et al., "Space compression methods with output data modification," *IEEE Trans. CAD if Integrated Circuits and Systems*, vol. CAD-6, No. 2, pp. 290-294, 1987.
Mano, "Computer System Architecture," 2nd Edition, Prentice-Hall, Inc., New Jersey, 1982.
Mrugalski et al., "Synthesis of pattern generators based on cellular automata with phase shifters," Proc. Int. Test Conf., pp. 368-377, 1999.
Muradali et al., "A new procedure for weighted random built-in self-test," *Proc. ITC.*, pp. 600-669, 1990.
Pateras et al., "Cube contained random patterns and their application to the complete testing of synthesized multi-level circuits," *Proc. ITC.*, pp. 473-482, 1991.
Pouya, "Synthesis of zero-aliasing elementary-tree space compactors," Proc. VLSI Test Symp., pp. 70-77, 1998.
Rajski et al., "Accumulator-based compaction of test responses," *IEEE Transactions on Comput.*, vol. C-42, No. 6, pp. 643-650, 1993.
Rajski et al., "Automated Synthesis of Large Phase Shifters for Built-In Self-Test," International Test Conference, Paper 41.1, pp. 1047-1056, IEEE 1998.
Rajski et al., "Design of Phase Shifters for BIST Applications", *Proc. VLSI Test Symposium*, pp. 218-224, 1998.
Rajski et al., "Test Data Decompression for Multiple Scan Designs with Boundary Scan," IEEE Transactions on Computers, vol. 47, No. 11, Nov. 1998.

Rajski et al., "Test responses compaction in accumulators with rotate carry adders," *IEEE Transactions CAD of Integrated Circuits and Systems*, vol. CAD-12, No. 4, pp. 531-539, 1993.
Rajski et al., "Decompression of Test Data Using Variable-Length Seed LFSRs", Microelectronics and Computer Systems Laboratory, McGill University, Montreal, Canada, 1995 IEEE.
Reddy et al., "A Data compression technique for built-in self-test," IEEE Trans. Comput., vol. C-37, pp. 1151-1156, 1988.
Savir, "Syndrome-testable design of combinational circuits," *IEEE Trans. Comput.* vol. C-29, No. 6, pp. 442-451, 1980.
Saxena et al., "Accumulator compression testing," *IEEE Trans. Comput.*, vol. C-35, No. 4, pp. 317-321, 1986.
Saxena et al., "Analysis of checksums, extended-precision checksums, and cyclic redundancy," *IEEE Trans. Comput.*, vol. C-39, No. 7, pp. 969-975, 1990.
Saxena et al., "Extended precision checksums," *Proc. FTCS*, pp. 142-147, 1987.
Serra et al., "The analysis of one-dimensional linear cellular automata and their aliasing properties," *IEEE Trans. CAD of Integrated Circuits and Systems*, vol. CAD-9, No. 7, pp. 767-778, 1990.
Smith, "Measures of the effectiveness of fault signature analysis," *IEEE Trans. Comput.*, vol. C-29, No. 6, pp. 510-514, 1980.
Touba et al., "Altering a pseudo-random bit sequence for scan-based BIST," Proc. ITC., pp. 167-175, 1996.
Touba et al., "Transformed pseudo-random patterns for BIST," *Proc. VLSI Test Symposium*, pp. 410-416, 1995.
Tsai et al., "STARBIST: Scan autocorrelated random pattern generation," *Proc. DAC*, pp. 472-477, 1997.
Venkataraman et al., "An Efficient BIST Scheme Based on Reseeding of Multiple Polynomial Linear Feedback Shift Registers", pp. 572-577, 1993 IEEE.
Waicukauski et al., "A method for generating weighted random test patterns," *IBM J. Res. Develop.*, vol. 33, No. 2, pp. 149-161, Mar. 1989.
Williams et al., "Bounds and analysis of aliasing errors in linear-feedback shift registers," *IEEE Trans. CAD of Integrated Circuits and Systems*, vol. CAD-7, No. 1, pp. 75-83, 1988.
Wunderlich et al., "Bit-flipping BIST," Proc. ICCAD, pp. 337-343, 1996.
Wunderlich, "Multiple distribution for biased random test patterns," *Proc. ITC*, pp. 236-244, 1988.
Wunderlich, "On computing optimized input probabilities for random tests," Proc. DAC pp. 392-398, 1987.
Yamaguchi et al., "An efficient method for compressing test data," Proc. ITC, pp. 191-199, 1997.
Yarmolik et al., Generation and Application of Pseudorandom Sequences for Random Testing, J. Wiley & Sons, New York, 1988.
Zacharia, "Decompression of Test Data Using Variable-Length Seed LFSRs," IEEE 1995, pp. 426-432.
Lew Yan Voon et al., "BIST Linear Generator based on Complemented Outputs," *IEEE VLSI Test Symp.*, pp. 137-142 (1992).
Zacharia et al., "Two-Dimensional Test Data Decompressor for Multiple Scan Designs," *International Test Conference*, pp. 186-194 (1996).
Zacharia et al., "Two-Dimensional Test Data Decompressor for Multiple Scan Designs," *International Test Conference*, pp. 186-194 (1996).
Lew Yan Voon et al., "BIST Linear Generator based on Complemented Outputs," *IEEE VLSI Test Symp.*, pp. 137-142 (1992).

* cited by examiner

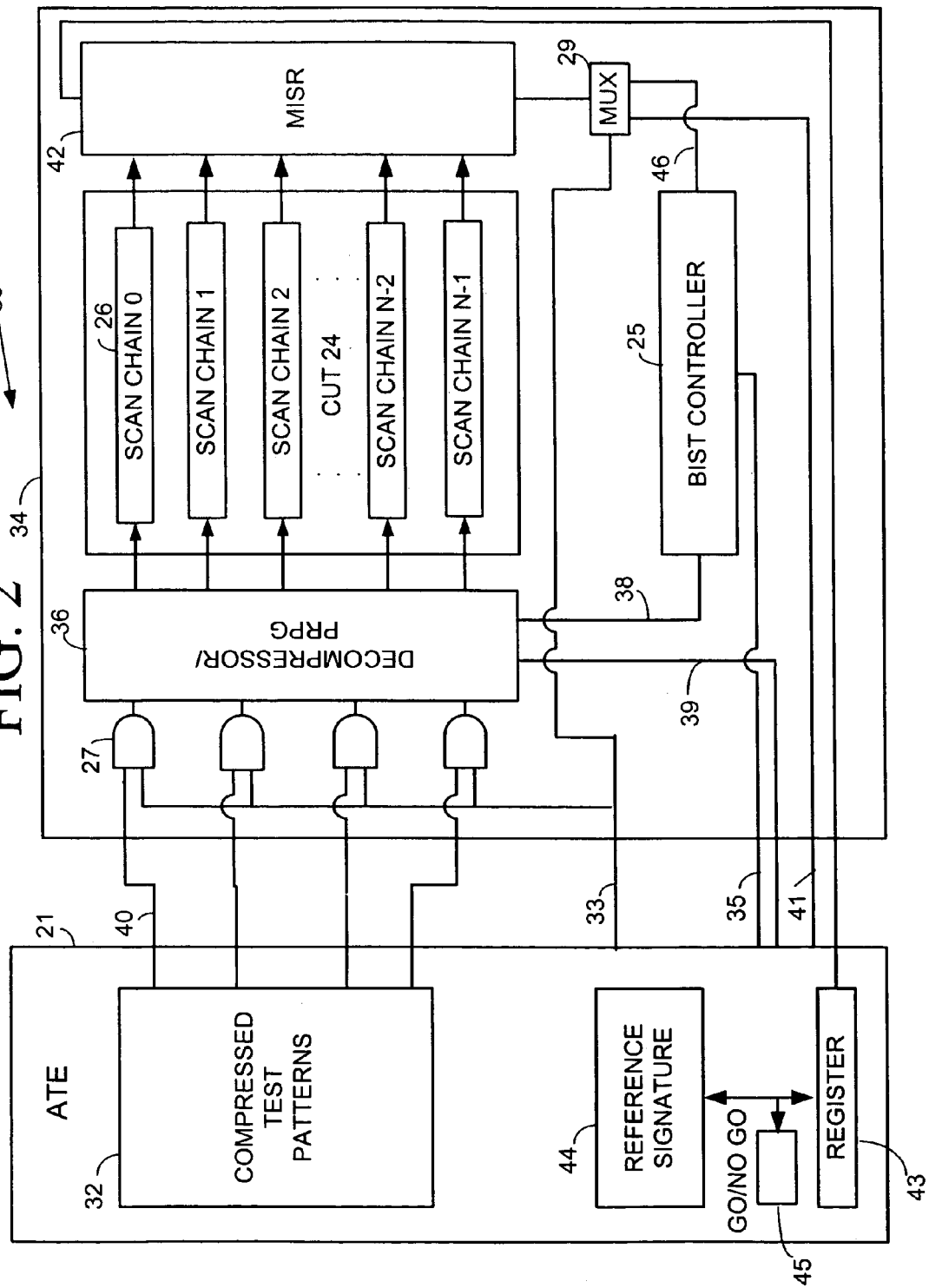

Scan chain 0
$a_2 \oplus a_4 \oplus a_5$
$a_4 \oplus a_6 \oplus a_7$
$a_1 \oplus a_6 \oplus a_8 \oplus a_9$
$a_1 \oplus a_3 \oplus a_8 \oplus a_{10} \oplus a_{11}$
$a_3 \oplus a_5 \oplus a_{10} \oplus a_{12} \oplus a_{13}$
$a_0 \oplus a_1 \oplus a_4 \oplus a_5 \oplus a_8 \oplus a_9 \oplus a_{11} \oplus a_{12} \oplus a_{13} \oplus a_{16}$
$a_0 \oplus a_2 \oplus a_7 \oplus a_9 \oplus a_{14} \oplus a_{16} \oplus a_{17}$
$a_0 \oplus a_2 \oplus a_4 \oplus a_9 \oplus a_{11} \oplus a_{16} \oplus a_{18} \oplus a_{19}$ Scan chain 1
$a_1 \oplus a_2 \oplus a_3 \oplus a_6$
$a_0 \oplus a_1 \oplus a_3 \oplus a_4 \oplus a_5 \oplus a_8$
$a_2 \oplus a_3 \oplus a_5 \oplus a_6 \oplus a_7 \oplus a_{10}$
$a_0 \oplus a_1 \oplus a_4 \oplus a_5 \oplus a_7 \oplus a_8 \oplus a_9 \oplus a_{12}$
$a_2 \oplus a_3 \oplus a_6 \oplus a_7 \oplus a_9 \oplus a_{10} \oplus a_{11} \oplus a_{14}$
$a_0 \oplus a_5 \oplus a_7 \oplus a_{12} \oplus a_{14} \oplus a_{15}$
$a_0 \oplus a_2 \oplus a_3 \oplus a_6 \oplus a_7 \oplus a_{10} \oplus a_{11} \oplus a_{13} \oplus a_{14} \oplus a_{15} \oplus a_{18}$
$a_0 \oplus a_1 \oplus a_2 \oplus a_4 \oplus a_5 \oplus a_8 \oplus a_9 \oplus a_{12} \oplus a_{13} \oplus a_{15} \oplus a_{16} \oplus a_{17} \oplus a_{20}$ Scan chain 2
$a_3$
$a_0 \oplus a_5$
$a_2 \oplus a_7$
$a_0 \oplus a_4 \oplus a_9$
$a_2 \oplus a_6 \oplus a_{11}$
$a_0 \oplus a_1 \oplus a_4 \oplus a_8 \oplus a_{13}$
$a_0 \oplus a_2 \oplus a_3 \oplus a_6 \oplus a_{10} \oplus a_{15}$
$a_1 \oplus a_2 \oplus a_4 \oplus a_5 \oplus a_8 \oplus a_{12} \oplus a_{17}$ Scan chain 3
$a_0 \oplus a_1 \oplus a_5 \oplus a_7$
$a_2 \oplus a_3 \oplus a_7 \oplus a_9$
$a_4 \oplus a_5 \oplus a_9 \oplus a_{11}$
$a_6 \oplus a_7 \oplus a_{11} \oplus a_{13}$
$a_1 \oplus a_8 \oplus a_9 \oplus a_{13} \oplus a_{15}$
$a_0 \oplus a_3 \oplus a_{10} \oplus a_{11} \oplus a_{15} \oplus a_{17}$
$a_0 \oplus a_2 \oplus a_5 \oplus a_{12} \oplus a_{13} \oplus a_{17} \oplus a_{19}$
$a_2 \oplus a_4 \oplus a_7 \oplus a_{14} \oplus a_{15} \oplus a_{19} \oplus a_{21}$ Scan chain 4
$a_0 \oplus a_4 \oplus a_7$
$a_0 \oplus a_2 \oplus a_6 \oplus a_9$
$a_0 \oplus a_1 \oplus a_2 \oplus a_4 \oplus a_8 \oplus a_{11}$
$a_0 \oplus a_2 \oplus a_3 \oplus a_4 \oplus a_6 \oplus a_{10} \oplus a_{13}$
$a_1 \oplus a_2 \oplus a_4 \oplus a_5 \oplus a_6 \oplus a_8 \oplus a_{12} \oplus a_{15}$
$a_1 \oplus a_3 \oplus a_4 \oplus a_6 \oplus a_7 \oplus a_8 \oplus a_{10} \oplus a_{14} \oplus a_{17}$
$a_1 \oplus a_3 \oplus a_5 \oplus a_6 \oplus a_8 \oplus a_9 \oplus a_{10} \oplus a_{12} \oplus a_{16} \oplus a_{19}$
$a_0 \oplus a_1 \oplus a_3 \oplus a_5 \oplus a_7 \oplus a_8 \oplus a_{10} \oplus a_{11} \oplus a_{12} \oplus a_{14} \oplus a_{18} \oplus a_{21}$ Scan chain 5
$a_0 \oplus a_5 \oplus a_6$
$a_0 \oplus a_1 \oplus a_2 \oplus a_7 \oplus a_8$
$a_2 \oplus a_3 \oplus a_4 \oplus a_9 \oplus a_{10}$
$a_0 \oplus a_4 \oplus a_5 \oplus a_6 \oplus a_{11} \oplus a_{12}$
$a_0 \oplus a_1 \oplus a_2 \oplus a_6 \oplus a_7 \oplus a_8 \oplus a_{13} \oplus a_{14}$
$a_0 \oplus a_1 \oplus a_2 \oplus a_3 \oplus a_4 \oplus a_8 \oplus a_9 \oplus a_{10} \oplus a_{15} \oplus a_{16}$
$a_2 \oplus a_3 \oplus a_4 \oplus a_5 \oplus a_6 \oplus a_{10} \oplus a_{11} \oplus a_{12} \oplus a_{17} \oplus a_{18}$
$a_1 \oplus a_4 \oplus a_5 \oplus a_6 \oplus a_7 \oplus a_8 \oplus a_{12} \oplus a_{13} \oplus a_{14} \oplus a_{19} \oplus a_{20}$ Scan chain 6
$a_0 \oplus a_1 \oplus a_2 \oplus a_6$
$a_1 \oplus a_2 \oplus a_3 \oplus a_4 \oplus a_8$
$a_3 \oplus a_4 \oplus a_5 \oplus a_6 \oplus a_{10}$
$a_1 \oplus a_5 \oplus a_6 \oplus a_7 \oplus a_8 \oplus a_{12}$
$a_0 \oplus a_1 \oplus a_3 \oplus a_7 \oplus a_8 \oplus a_9 \oplus a_{10} \oplus a_{14}$
$a_0 \oplus a_2 \oplus a_3 \oplus a_5 \oplus a_9 \oplus a_{10} \oplus a_{11} \oplus a_{12} \oplus a_{16}$
$a_0 \oplus a_2 \oplus a_4 \oplus a_5 \oplus a_7 \oplus a_{11} \oplus a_{12} \oplus a_{13} \oplus a_{14} \oplus a_{18}$
$a_0 \oplus a_2 \oplus a_4 \oplus a_6 \oplus a_7 \oplus a_9 \oplus a_{13} \oplus a_{14} \oplus a_{15} \oplus a_{16} \oplus a_{20}$ Scan chain 7
$a_2 \oplus a_3 \oplus a_5$
$a_0 \oplus a_4 \oplus a_5 \oplus a_7$
$a_0 \oplus a_2 \oplus a_6 \oplus a_7 \oplus a_9$
$a_1 \oplus a_2 \oplus a_4 \oplus a_8 \oplus a_9 \oplus a_{11}$
$a_0 \oplus a_3 \oplus a_4 \oplus a_6 \oplus a_{10} \oplus a_{11} \oplus a_{13}$
$a_1 \oplus a_2 \oplus a_5 \oplus a_6 \oplus a_8 \oplus a_{12} \oplus a_{13} \oplus a_{15}$
$a_1 \oplus a_3 \oplus a_4 \oplus a_7 \oplus a_8 \oplus a_{10} \oplus a_{14} \oplus a_{15} \oplus a_{17}$
$a_0 \oplus a_3 \oplus a_5 \oplus a_6 \oplus a_9 \oplus a_{10} \oplus a_{12} \oplus a_{16} \oplus a_{17} \oplus a_{19}$

FIG. 6

DECOMPRESSOR/PRPG FOR APPLYING PSEUDO-RANDOM AND DETERMINISTIC TEST PATTERNS

RELATED APPLICATION DATA

This application is a continuation of U.S. patent application Ser. No. 09/713,664, filed Nov. 15, 2000 now U.S. Pat. No. 6,684,385, which claims the benefit of U.S. Provisional Application No. 60/167,137, filed Nov. 23, 1999, both of which are hereby incorporated by reference.

TECHNICAL FIELD

This invention relates generally to testing of integrated circuits and, more particularly, to the generation and application of test data in the form of patterns, or vectors, to scan chains within a circuit-under-test.

BACKGROUND

Built-in self-test (BIST) is emerging as an attractive alternative to conventional methods of testing microelectronics devices at time of manufacture. In BIST, additional circuitry is added to a circuit-under-test to provide on-chip test-pattern generation, test-response evaluation, and test control. Consequently, BIST is significantly changing the way that integrated circuits are tested. It reduces testing cost by shortening test application time, minimizing the amount of test data that must be stored by an external tester, and reducing tester costs. Its implementation can result in a reduction of the product development cycle and a reduction in the cost of system maintenance.

The basic BIST objectives are on-chip test-pattern generation and test-response compaction. By far the most commonly-used means for generating test patterns on chip are pseudo-random test pattern generators (PRPGs). A PRPG generates a set of test patterns based on an initial value, or seed, loaded into memory elements within the PRPG. The popularity of pseudo-random tests stems from the very simple hardware required to implement the test generation. The two principal forms of PRPGs, which evolved over time and are now commonly in use, are both linear finite state machines: linear feedback shift registers (LFSRs) and one-dimensional linear hybrid cellular automata (LHCAs).

Typically, an LFSR consists of interconnected memory elements (also referred to as flip-flops, stages, cells, etc.) and linear logic elements (such as XOR or XNOR gates). An LFSR of length n can be also represented by its characteristic polynomial $h_n x^n + h_{n-1} x^{n-1} + \ldots + h_0$, where the term $h_i x^i$ refers to the ith flip-flop of the register, such that, if $h_i=1$, then there is a feedback tap taken from this flip-flop. Also, $h_0=1$. FIG. 1A shows a type I LFSR, or Fibonacci generator. FIG. 1B shows a type II LFSR, or Galois generator, which uses a shift register with interspersed XOR gates. If an LFSR (of either type) is initialized to a nonzero value, then it can cycle through a number of states before coming back to the initial state. A characteristic polynomial which causes an n-bit LFSR to go through all possible $2^n-1$ nonzero states is called a primitive characteristic polynomial. The corresponding LFSR is often referred to as a maximum-length LFSR, and the resultant output sequence is termed a maximum-length sequence or m-sequence.

An LHCA is a collection of memory cells connected in such a way that each cell is restricted to local neighborhood interactions. These relationships are expressed by rules that determine the next state of a given cell based on information received from its neighbors. For example, if cell c can communicate only with its two neighbors, c−1 and c+1, the so-called rules 90 and 150 are usually employed. The rule 90 can be implemented by a linear logic according to the formula $x_c(t+1)=x_{c-1}(t) \oplus x_{c+1}(t)$, while the rule 150 satisfies the equation $x_c(t+1)=x_{c-1}(t) \oplus x_c(t) \oplus x_{c+1}(t)$, where $x_c(t)$ represents the state of cell c at time t. An example of an LHCA is shown in FIG. 1C. This automaton features null boundary conditions. That is, the conditions behave as if the boundary always supplies a zero from beyond the automaton to the inputs to the exterior cells. In an alternative embodiment, the LHCA has cyclic boundary conditions in which the inputs to the exterior cells are connected so that the automaton forms a circle. Contrary to the LHCA with null boundary conditions, the LHCA with cyclic boundary conditions is unable to produce an m-sequence.

Although LFSRs and LHCAs can generate a large set of pseudo-random test patterns from one seed, this set seldom provides sufficient fault coverage for a circuit-under-test. At best, 95–96% coverage of stuck-at faults can be achieved, even if test points are added to the circuit-under-test to address random pattern-resistant faults. If higher fault coverage is desired, the pseudo-random test patterns must be supplemented in some way. One supplementing technique is to provide from an external tester additional seeds to the PRPG that target specific faults not detected by the initial seed. Each additional seed generates a set of patterns. Each set, however takes considerable time to generate. Another supplementing technique is to provide fully specified deterministic patterns that bypass the PRPG and target directly the remaining, random pattern resistant faults. This reduces testing time, but increases memory requirements because the external tester memory required to store these "top-up" patterns is significant, often exceeding 50% of the memory required for a complete set of deterministic patterns.

SUMMARY

In accordance with the invention, a method for applying test patterns to scan chains in a circuit-under-test is described and shown herein. The method comprises, in a pseudo-random phase of operation, providing an initial value; generating from the initial value a set of pseudo-random test patterns; and applying the pseudo-random test patterns to the scan chains in the circuit-under-test. In a deterministic phase of operation, the method comprises providing a set of compressed deterministic test patterns; decompressing the compressed deterministic test patterns into decompressed deterministic test patterns; and applying the decompressed deterministic test patterns to the scan chains in the circuit-under-test. The decompressing of a compressed deterministic test pattern into a decompressed test pattern of bits occurs as the compressed deterministic test pattern is being provided. The applying of a decompressed deterministic test pattern to scan chains of the circuit-under-test may occur as a compressed deterministic test pattern is being provided.

In one aspect of the invention, the method may be applied to a circuit comprising a decompressor/PRPG, control circuitry, circuit logic, and scan chains. The control circuitry is coupled to the decompressor/PRPG and operable to cause the decompressor/PRPG to generate, in a pseudo-random phase of operation, a set of pseudo-random patterns and to generate, in a deterministic phase of operation, a set of deterministic test patterns. The scan chains are coupled to the circuit logic and operable to receive test patterns generated by the decompressor/PRPG and to capture responses to the test patterns generated by the circuit logic.

The decompressor/PRPG may include a linear finite state machine that can take various forms, such as a linear feedback shift register or a cellular automaton. The decompressor/PRPG may also include a phase shifter, which may be constructed of linear logic gates.

These and other aspects of the invention will become apparent from the following detailed description of an exemplary embodiment, which makes references to the accompanying drawings.

BRIEF DESCRIPTION OF THE DRAWINGS

FIG. 2 is a block diagram of a test system according to the invention.

FIG. 6 shows the logical expressions for the bits stored in each scan cell in the scan chain of FIG. 3 produced by the decompressor/PRPG and phase shifter.

DETAILED DESCRIPTION

Figure 1A:
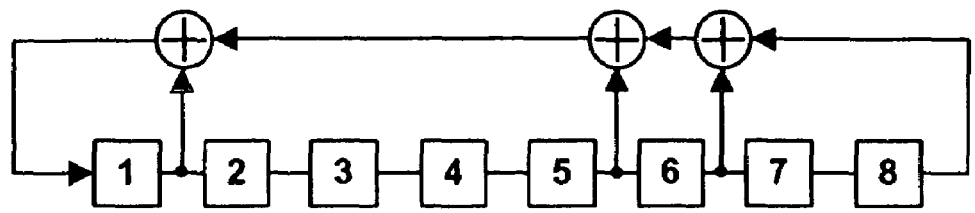
FIGS. 1A–C are block diagrams of several well-known types of linear finite state machines that are used to generate pseudo-random test patterns.
Figure 1B:
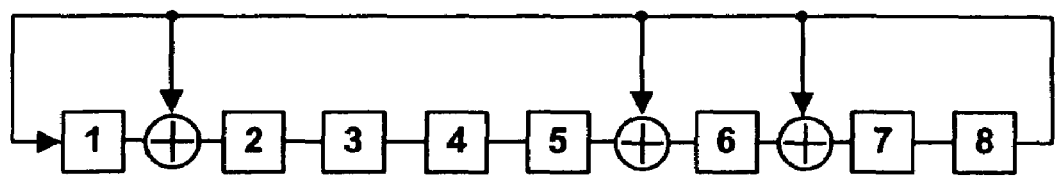
Figure 1C:
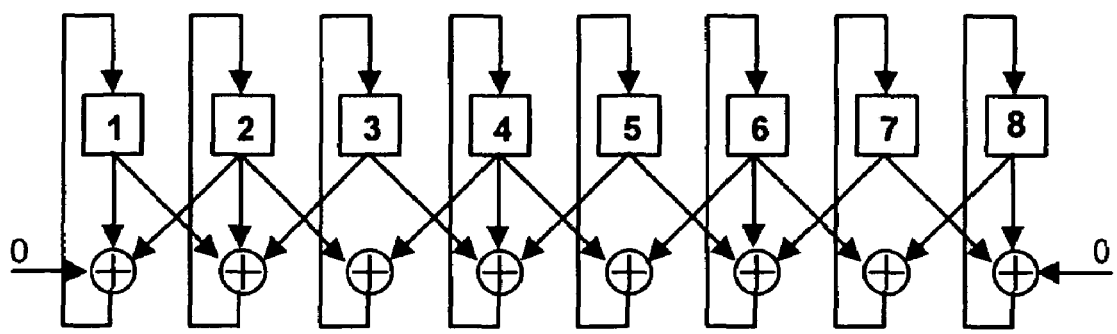

In accordance with the invention, testing of electronic circuits that include scan chains is accomplished in two phases of operation: a pseudo-random phase, in which a decompressor/PRPG generates pseudo-random test patterns for the circuit-under-test, and a deterministic phase, in which the decompressor/PRPG generates deterministic test patterns for the circuit-under test. The two testing phases can be executed in either order and at the substantially the same time (e.g., while the circuit being tested is connected to a tester) or at substantially different times. For example, the deterministic phase may be executed only during manufacture testing if desired, and the pseudo-random phase executed only during field testing. Or both phases can be executed at manufacture testing, and the pseudo-random-phase again executed periodically in the field to ensure that the circuit is maintained. By providing both types of test patterns and by providing the deterministic test patterns in a compressed format, a high level of fault coverage can be achieved with acceptable tester time and memory requirements. In an exemplary embodiment of the invention described herein, the decompressor/PRPG is embedded on a microchip that includes the circuit-under-test and executes the two phases of operation under the joint control of an on-chip BIST controller and an external tester.

Prior to testing, an automatic test pattern generation (ATPG) tool is employed to determine which deterministic test patterns are required to supplement the coverage of the pseudo-random patterns provided by the PRPG. This tool performs fault simulation of all pseudo-random patterns applied to a circuit-under-test and determines thereby which faults are detected and which are not. The faults that are undetected by pseudo-random patterns are then targeted, one by one. For one or more testable faults, the ATPG tool produces a test cube—a partially specified test pattern. For each test cube another tool, a solver of systems of linear equations, may be used to produce a compressed deterministic test pattern. These compressed patterns, when applied to the inputs of the decompressor/PRPG and shifted into the scan chains, produce values consistent with all specified positions of the original test cube.

FIG. 2 is a block diagram of a test system 30 according to the invention. The system includes a tester 21 such as external automatic testing equipment (ATE) and a circuit 34 that includes as all or part of it a circuit-under-test (CUT) 24. Embedded within the CUT 24 is circuit logic to be tested and multiple scan chains 26. The circuit 34 also includes a decompressor/PRPG 36 coupled to the scan chains 26, control circuitry such as a BIST controller 25 and a set of one or more AND logic gates 27; a multiplexer 29; and a multiple input signature register (MISR) 42.

The tester 21 is operable to provide a set of compressed deterministic test patterns to the decompressor/PRPG 36 through tester scan channels 40 and the set of AND gates 27. The BIST controller 25 is operable to provide an initial value to the decompressor/PRPG through a seed/reset line 38. (Alternatively, the tester 21 could be configured to provide this initial value over certain channels.) As will be explained, the control circuitry (the BIST controller and AND gates in this embodiment) are operable to configure the decompressor/PRPG to generate, in a pseudo-random phase of operation, a set of pseudo-random patterns from the initial value for the scan chains and to generate, in a deterministic phase of operation, a set of decompressed deterministic test patterns from the set of compressed deterministic test patterns for the scan chains. Other connections of particular interest in test system 30 include a tester-BIST controller communication line 35 between the controller 25 and the tester 21; a MISR reset select line 33 between the tester 21 and select terminal of the multiplexer 29; and a decompressor reset line 39 between the tester 21 and the decompressor/PRPG 36. Connected to the input terminals of the multiplexer 29 are MISR reset lines 41 and 46 from the tester and BIST controller, respectively. The input terminal of the MISR 42 is coupled to the output terminal of the multiplexer 29, which thus passes a reset signal from either the tester or BIST controller to the MISR. The output terminal of the MISR is coupled to a register 43 within the tester 21, which receives the test response signatures from the MISR for comparison against reference signatures 44 at comparator 45. A decision (Go/No Go) is made based on the comparison whether the CUT 24 contains a fault.

It should be understood that this block diagram represents the functional relationships between the various parts of the test system. The physical design of the test system can vary, depending upon the desired implementation. Conventional elements of such a design, which are not shown, include clock signals, gates, power, etc. and other elements known in the art for carrying out the various functions.

Before describing the structure of the decompressor/PRPG 36 in more detail, the operation of the test system overall and the decompressor/PRPG will first be explained. Assume that the pseudo-random phase of testing is executed first, although the two phases of operation can be executed in either order. The tester 21 notifies the BIST controller via line 35 to initiate the generation of pseudo-random test patterns. Through line 33, the tester also disables AND gates 27 and selects the reset signal on line 46 as the output of multiplexer 29. By disabling the AND gates, the compressed deterministic test patterns 32 from the tester are prevented from influencing the output of the decompressor/PRPG 36. And by selecting the reset signal on line 46, the tester enables controller 25 to reset the MISR before it stores compacted test responses from the scan chains.

The BIST controller 25 responds to the tester notification by transmitting a reset signal on line 38 (reset/seed) to the decompressor/PRPG and a reset signal on line 46 to the MISR 42. In the present embodiment, the initial value (seed) is hard-wired into the decompressor/PRPG, so that a high logic level on line 38 loads the seed into the decompressor/PRPG and a low logic level allows the decompressor/PRPG to generate pseudo-random patterns therefrom. Other ways for resetting and loading the seed are, or course, possible. Once the seed has been loaded, the decompressor/PRPG is clocked to generate a set of pseudo-random test patterns that are applied to the scan chains 26 within the CUT 24 (e.g., two hundred fifty thousand patterns, with perhaps one hundred shifts per pattern to load each into the scan chains). After the circuit logic within the CUT 24 is clocked with each pseudo-random test pattern, the test response to that pattern is captured in the scan chains 26 and passed to the MISR 42, which compresses the multiple test pattern responses into a signature. This signature is then sent to the register 43 within the tester 21 for comparison with a reference signature 44 at comparator 45. If the comparison shows a difference, then a fault exists in CUT 24. The comparison technique can vary. For example, the pseudo-random test patterns and deterministic patterns may be compressed and compared separately to different reference signatures, as just described. Another option is to compress all the test patterns, pseudo-random and deterministic, into one signature and then compare it to a single reference signature.

The BIST controller 25 monitors the number of pseudo-random patterns applied and the shifts through the scan chains by counting the clock pulses controlling the decompressor/PRPG. When the clock pulses indicate that a desired number of the pseudo-random test patterns has been applied and the test results captured in the MISR, the controller notifies the tester 21 via line 35 that the pseudo-random phase of operation is complete. The tester responds by initializing the test system 30 for the deterministic phase. This includes enabling the AND gates 27 via line 33 and selecting the tester MISR reset line 41 as the output of multiplexer 29. The tester also resets the decompressor/PRPG via line 39 in advance of applying the compressed deterministic patterns 32 from its memory and resets the MISR 42 via line 41, if two separate response signatures are generated.

The tester 21 then provides from a set of compressed test patterns 32 of bits, one pattern at a time, through scan channels 40 to the circuit 34. A compressed pattern, as will be described, contains far fewer bits than a fully specified (i.e., uncompressed or conventional) test pattern. A compressed pattern need contain only enough information to recreate deterministically specified bits, whereas a conventional pattern also contains randomly specified bits. Consequently, a compressed pattern is typically 2% to 5% of the size of a conventional test pattern and requires much less tester memory for storage than conventional patterns. As importantly, compressed test patterns require much less time to transmit from a tester to a CUT 24. (Alternatively, uncompressed deterministic test patterns can be used in addition to the compressed patterns, if desired.)

The compressed test patterns 32 are continuously provided from the tester 21 to scan chains 26 within the CUT 24 without interruption (i.e., the decompressing of a compressed deterministic test pattern into a decompressed test pattern of bits occurs as the compressed deterministic test pattern is being provided). Specifically, as a compressed test pattern is being provided by the tester 21 to the input channels of the decompressor/PRPG 36, it decompresses the compressed pattern into a decompressed pattern of bits. The decompressed test pattern is then applied to the scan chains 26 in the CUT 24, and can be done while the compressed test pattern is being provided to the circuit 34 (i.e., the applying of a decompressed deterministic test pattern to scan chains of the circuit-under-test can occur as a compressed deterministic test pattern is being provided). After the circuit logic within the CUT 24 is clocked with a decompressed deterministic test pattern, the test response to that pattern is captured in the scan chains and passed to the MISR 42, where it is compacted as part of a signature. When the response to all of the deterministic patterns have been compressed as a signature, the tester is notified and it requests that the signature be transmitted for comparison with the reference signature 44 at comparator 45. The comparison yields a test result (Go/No Go) that indicates whether the CUT 24 has a fault and should be rejected. As noted above, there may be a single signature or multiple partial signatures for a CUT 24 which are created and compared, depending on design choices.

In a typical configuration, the decompressor/PRPG 36 has one output per scan chain 26, and there are more scan chains than scan channels 40 to the decompressor/PRPG. However, as will be described, other configurations are also possible in which the decompressor/PRPG outputs are fewer than or equal to the input channels. The decompressor/PRPG generates in a given time period a greater number of decompressed bits at its outputs than the number of compressed pattern bits it receives during the same time period. This is an act of decompression, whereby the decompressor/PRPG 36 generates a greater number of bits than are provided to it in a given time period. As explained below, decompression comprises generating one or more bits of a decompressed pattern by logically combining two or more bits of a compressed test pattern. For example, the compressed bits can be combined with an XOR operation or an XNOR operation.

To reduce the data volume of the test response and the time for sending the response to the tester, the circuit 34 may include means for compressing the test response that is read from the scan chains 26. One structure for providing such compression is the multiple input signature register (MISR) 42 described above. Another structure for providing such compression is one or more spatial compactors (not shown), especially for the deterministic test patters. The compressed test responses produced by the compactors are compared one by one with compressed reference responses within the tester. A fault is detected if a reference response does not match an actual response.

The providing of a compressed test pattern to a circuit, its decompression into a decompressed test pattern, and the application of the decompressed test pattern to the scan chains is performed synchronously, continuously, and substantially concurrently. The rate at which each act occurs, however, can vary. All acts can be performed synchronously at a same clock rate if desired. Or the acts can be performed at different clock rates. If the acts are performed at the same clock rate, or if the compressed test patterns are provided and decompressed at a higher clock rate than at which the decompressed test patterns are applied to the scan chains, then the number of outputs of decompressor/PRPG 36 and associated scan chains will exceed the number of input channels of the decompressor/PRPG. In this first case, decompression is achieved by providing more decompressor/PRPG outputs than input channels. If the compressed test patterns are provided at a lower clock rate and decompressed and applied to the scan chains at a higher clock rate, then the number of outputs and associated scan chains can be the same, fewer, or greater than the number of input channels. In this second case, decompression is achieved by generating the decompressed test pattern bits at a higher clock rate than the clock rate at which the compressed test pattern bits are provided.

Figure 3:
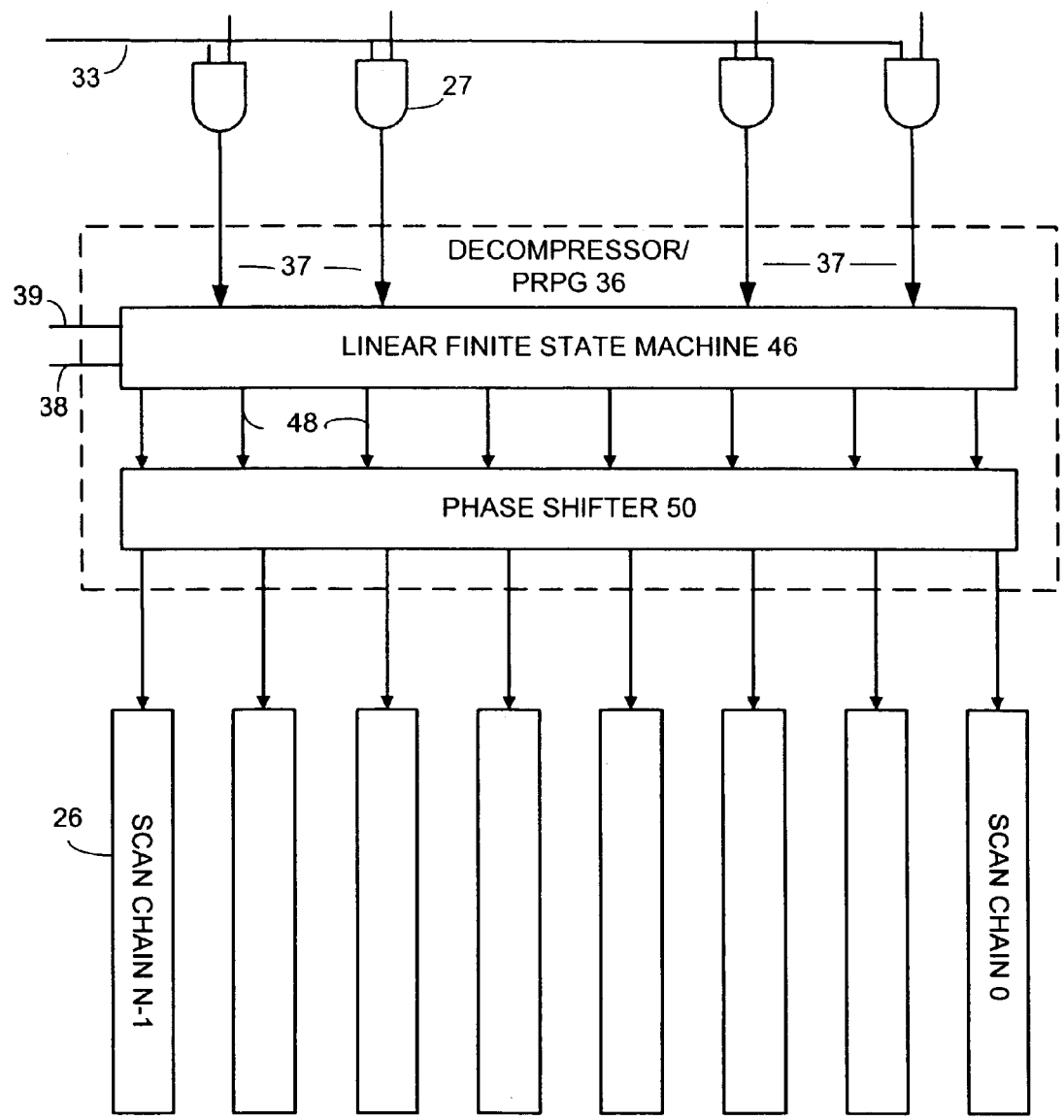
FIG. 3 is a block diagram of a circuit that includes a decompressor/PRPG in the form of an LFSM, a phase shifter and scan chains in accordance with the invention.

FIG. 3 is a block diagram of one possible embodiment of a decompressor/PRPG 36 in accordance with the invention. The decompressor/PRPG 36 includes a number of input channels 37 through which compressed deterministic test patterns are received from the tester 21 via AND gates 27. The decompressor is also connected to lines 38 and 39 (shown in more detail in FIG. 4). In this embodiment, the decompressor/PRPG is a linear finite state machine (LFSM) 46 coupled, if desired, through its taps 48 to a phase shifter 50. The LFSM through the phase shifter provides highly linearly independent test patterns to the inputs of numerous scan chains 26 in the CUT 24. The LFSM can be built on the basis of the canonical forms of linear feedback shift registers, cellular automata, or transformed LFSRs that can be obtained by applying a number of m-sequence preserving transformations. The output of the LFSM is applied through output channels to the phase shifter 50, which ensures that the decompressed pattern bits present within each of the multiple scan chains 26 at any given time do not overlap in pattern (i.e., are out of phase).

The concept of continuous flow decompression described herein rests on the fact noted above that deterministic test patterns typically have only between 2 to 5% of bits deterministically specified, with the remaining bits randomly filled during test pattern generation. (Test patterns with partially specified bit positions are called test cubes, an example of which appears in Table 2.) These partially specified test cubes are compressed so that the test data volume that has to be stored externally is significantly reduced. The fewer the number of specified bits in a test cube, the better is the ability to encode the information into a compressed pattern. The ability to encode test cubes into a compressed pattern is exploited by having a few decompressor input channels driving the circuit-under-test, which are viewed by the tester as virtual scan chains. The actual CUT 24, however, has its memory elements connected into a large number of real scan chains. Under these circumstances, even a low-cost tester that has few scan channels and sufficiently small memory for storing test data can drive the circuit externally.

Figure 4:
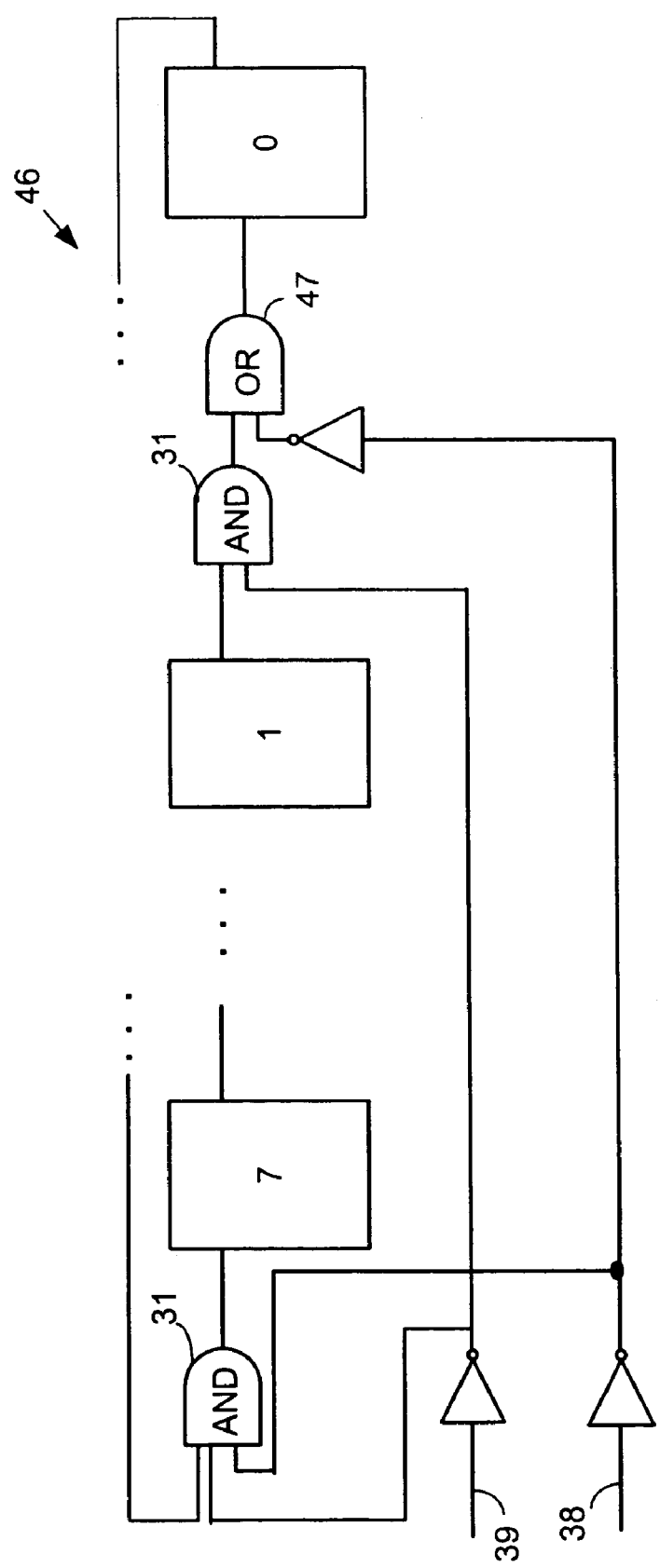
FIG. 4 shows structure for initializing a decompressor/PRPG.

FIG. 4 shows one possible means for the tester and BIST controller to initialize the decompressor/PRPG 36. Line 39, which provides a tester reset signal before the application of each deterministic pattern, is coupled to each of the memory elements (stages) of the LFSM 46. When active (high), the signal on line 39 resets each memory element to a zero value through an AND gate 31 coupled to the input terminal of each element. When inactive (low), the reset signal has no effect on the operation of the LFSM. Line 38, which provides a seed/reset signal from the BIST controller, is also coupled to each memory element of the LFSM. The particular coupling at each element determines the binary value of the seed at that element; thus, the seed is "hard-wired" into the LFSM. When the signal on line 38 is high, it loads the seed by setting each element to a binary predetermined value. In FIG. 4, for example, element 7 is set to 0 because the high signal on line 38 disable the adjacent AND gate 31. Element 0, in contrast, is set to 1 because the OR gate 47 adjacent to the element passes the high signal to the element regardless of the value provided by the output terminal of adjacent element 1. Other initialization means are, of course, possible, such as transmitting a seed from the BIST controller or tester rather than wiring it into the LFSM.

Figure 5:
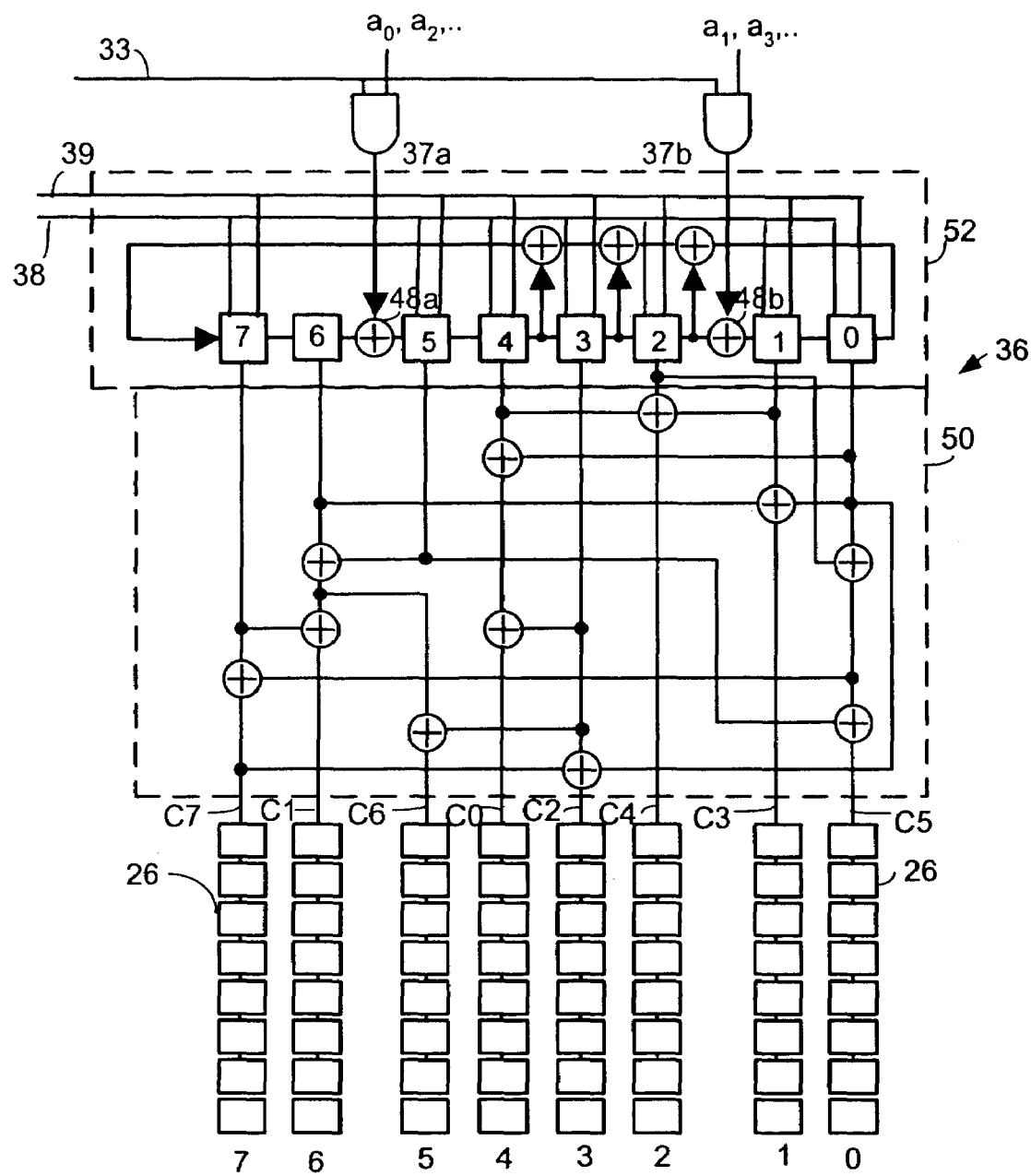
FIG. 5 shows further detail of a decompressor/PRPG.

FIG. 5 shows in more detail an exemplary decompressor/PRPG, with an LFSM embodied in an eight-stage type I LFSR 52 implementing primitive polynomial $h(x)=x^8+x^4+x^3+x^2+1$. Lines 38 and 39 are shown connected to each memory element of the LFSR. The phase shifter 50, embodied in a number of XOR gates, drives eight scan chains 26, each eight bits long. The structure of the phase shifter is selected in such a way that a mutual separation between the shifter's output channels C0–C7 is at least eight bits, and all output channels are driven by 3-input (tap) XOR functions having the following forms:

TABLE 1

$$C_0 = s_4 \oplus s_3 \oplus s_0$$
$$C_1 = s_7 \oplus s_6 \oplus s_5$$
$$C_2 = s_7 \oplus s_3 \oplus s_2$$
$$C_3 = s_6 \oplus s_1 \oplus s_0$$
$$C_4 = s_4 \oplus s_2 \oplus s_1$$
$$C_5 = s_5 \oplus s_2 \oplus s_0$$
$$C_6 = s_6 \oplus s_5 \oplus s_3$$
$$C_7 = s_7 \oplus s_2 \oplus s_0$$

where $C_i$ is the ith output channel and $s_k$ indicates the kth stage of the LFSR. Assume that the LFSR 52 is fed every clock cycle through its input channels 37a, 37b and input injectors 48a, 48b (XOR gates) to the second and the sixth stages of the register. The input variables "a" (compressed test pattern bits) received on channel 37a are labeled with even subscripts ($a_0$, $a_2$, $a_4$, . . . ) and the variables "a" received on channel 37b are labeled with odd subscripts ($a_1$, $a_3$, $a_5$, . . . . ). Treating these external variables as Boolean, all scan cells can be conceptually filled with symbolic expressions being linear functions of input variables injected by tester 21 into the LFSR 52. Given the feedback polynomial, the phase shifter 50, the location of injectors 48a, b as well as an additional initial period of four clock cycles during which only the LFSR is supplied by test data, the contents of each scan cell within the scan chains 26 can be logically determined.

FIG. 6 gives the expressions for the sixty-four cells in the scan chains of FIG. 5, with the scan chains identified as 0 through 7 at the bottom of FIG. 5. The expressions for each scan chain cell in FIG. 6 are listed in the order in which the information is shifted into the chain, i.e., the topmost expression represents the data shifted in first to the chain and thus corresponds to the information stored in the bottom cell of that chain.

Assume that the decompressor/PRPG 36 in FIG. 5 is to generate a test pattern based on the following partially specified test cube in Table 2 (the contents of the eight scan chains are shown here horizontally, with the leftmost column representing the information that is shifted first into the scan chains and which thus resides in the bottom scan chain cell):

TABLE 2

| | | | | | | | | |
|---|---|---|---|---|---|---|---|---|
| x | x | x | x | x | x | x | x | scan chain 0 |
| x | x | x | x | x | x | x | x | scan chain 1 |
| x | x | x | x | 1 | 1 | x | x | scan chain 2 |
| x | x | 0 | x | x | x | 1 | x | scan chain 3 |
| x | x | x | x | 0 | x | x | 1 | scan chain 4 |
| x | x | 0 | x | 0 | x | x | x | scan chain 5 |
| x | x | 1 | x | 1 | x | x | x | scan chain 6 |
| x | x | x | x | x | x | x | x | scan chain 7 |

There are only ten deterministically specified bits; the variable x denotes a "don't care" condition. Then a corresponding compressed test pattern can be determined by solving the following system of ten equations from FIG. 5 using any of a number of well-known techniques such as Gauss-Jordan elimination techniques. The selected equations correspond to the ten deterministically specified bits:

TABLE 3

$$a_2 \oplus a_6 \oplus a_{11} = 1$$
$$a_0 \oplus a_1 \oplus a_4 \oplus a_8 \oplus a_{13} = 1$$
$$a_4 \oplus a_5 \oplus a_9 \oplus a_{11} = 0$$
$$a_0 \oplus a_2 \oplus a_5 \oplus a_{12} \oplus a_{13} \oplus a_{17} \oplus a_{19} = 1$$
$$a_1 \oplus a_2 \oplus a_4 \oplus a_5 \oplus a_6 \oplus a_8 \oplus a_{12} \oplus a_{15} = 0$$
$$a_0 \oplus a_1 \oplus a_3 \oplus a_5 \oplus a_7 \oplus a_8 \oplus a_{10} \oplus a_{11} \oplus a_{12} \oplus a_{14} \oplus a_{18} \oplus a_{21} = 1$$
$$a_2 \oplus a_3 \oplus a_4 \oplus a_9 \oplus a_{10} = 0$$
$$a_0 \oplus a_1 \oplus a_2 \oplus a_6 \oplus a_7 \oplus a_8 \oplus a_{13} \oplus a_{14} = 0$$
$$a_3 \oplus a_4 \oplus a_5 \oplus a_6 \oplus a_{10} = 1$$
$$a_0 \oplus a_1 \oplus a_3 \oplus a_7 \oplus a_8 \oplus a_9 \oplus a_{10} \oplus a_{14} = 1$$

It can be verified that the resulting seed variables $a_0$, $a_1$, $a_2$, $a_3$ and $a_{13}$ are equal to the value of one while the remaining variables assume the value of zero. This seed will subsequently produce a fully specified test pattern in the following form (the initial specified positions are underlined):

TABLE 4

| | | | | | | | |
|---|---|---|---|---|---|---|---|
| 1 | 0 | 1 | 0 | 0 | 1 | 0 | 0 |
| 1 | 1 | 0 | 0 | 0 | 1 | 0 | 0 |
| 1 | 1 | 1 | 1 | <u>1</u> | <u>1</u> | 1 | 0 |
| 0 | 0 | <u>0</u> | 1 | 0 | 0 | <u>1</u> | 1 |
| 1 | 0 | 1 | 0 | <u>0</u> | 0 | 0 | <u>1</u> |
| 1 | 1 | <u>0</u> | 1 | <u>0</u> | 0 | 0 | 0 |
| 1 | 1 | <u>1</u> | 1 | <u>1</u> | 1 | 1 | 1 |
| 0 | 1 | 0 | 0 | 1 | 1 | 0 | 0 |

The compression ratio is defined as the number of scan cells divided by the number of bits required to place the test pattern within the cells. In the embodiment of FIG. 5, four bits are provided at each of the two injectors to fill the decompressor/PRPG and then eight additional bits are provided at each of the two injectors to complete the generation of content for each of the scan cells. This achieves a compression ratio of 64/(2×8+2×4)≈2.66. With no compression, the ratio would be less than one (64/(8×8+8×4)≈0.67).

Figure 7A:
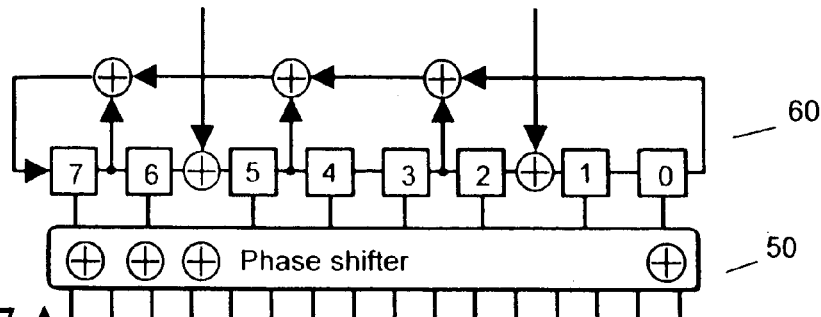
FIGS. 7A–D illustrate alternative embodiments of the LFSM shown in FIG. 3.
Figure 7B:
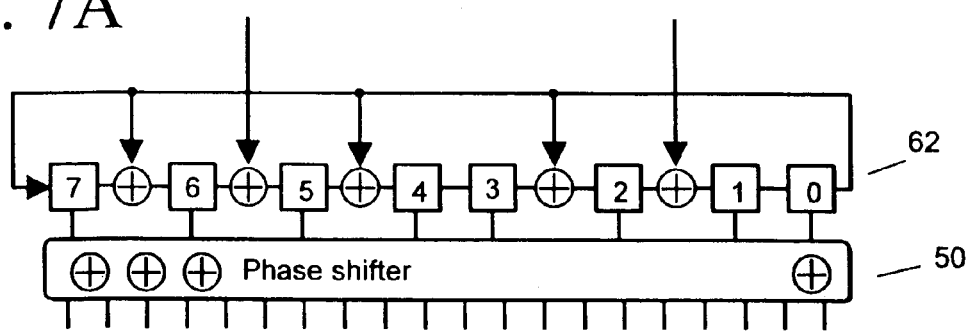
Figure 7C:
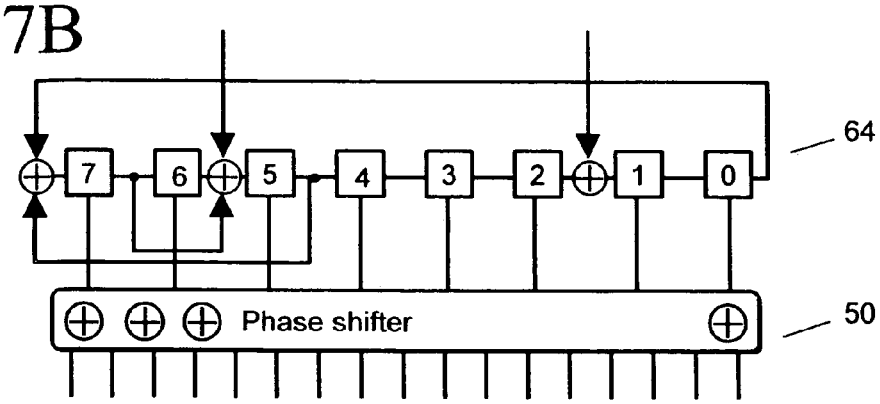
Figure 7D:
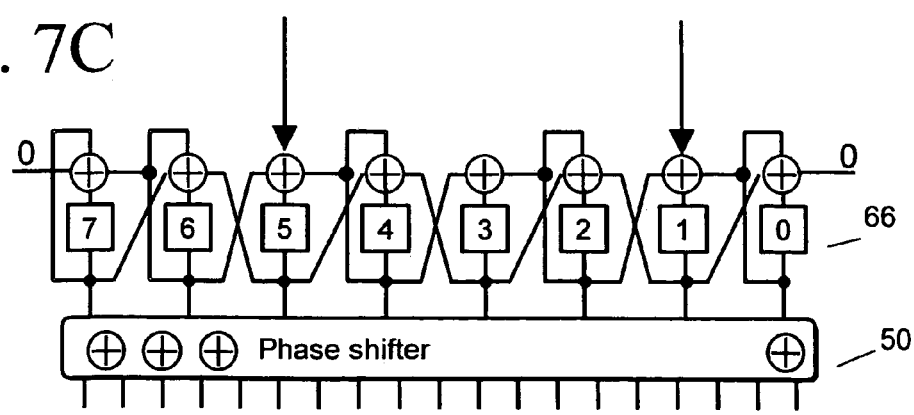

FIGS. 7A–D illustrate various embodiments for the LFSM 46 of FIG. 3. FIG. 7A is a type I LFSR 60. FIG. 7B is a type II LFSR 62. FIG. 7C is a transformed LFSR 64. And FIG. 7D is a cellular automaton 66. All of them implement primitive polynomials. Except for the cellular automaton 66, in each case the LFSM includes a number of memory elements connected in a shift register configuration. In addition, there are several feedback connections between various memory cells that uniquely determine the next state of the LFSM. The feedback connections are assimilated into the design by introducing injectors in the form of XOR gates near the destination memory elements. The input channels 37*a*, 37*b* provide the bits of a compressed pattern to the LFSM through input injectors 48*a, b*. The injectors are handled similarly as the other feedback connections within the LFSM except that their sources of bits are the input channels. The input channels 37 may have multiple fan-outs driving different LFSM injectors 48 to improve the encoding efficiency.

Figure 8:
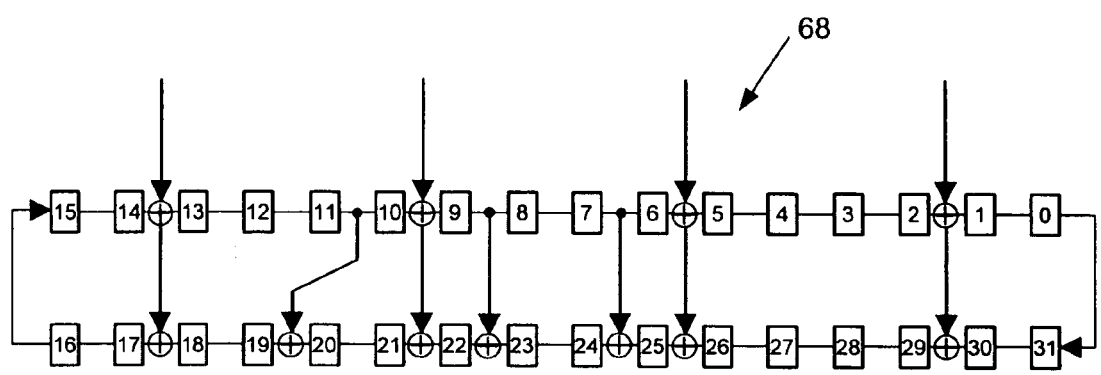
FIG. 8 illustrates an embodiment of a 32-bit LFSM.

FIG. 8 shows a preferred embodiment of a 32-bit LFSM in the form of a re-timed LFSR 68. The injectors are spaced equally so that the input variables are distributed optimally once they are injected into the LFSM. In practice, the size of the LFSM depends on the number of real scan chains in a circuit, the desired compression ratio of encoding, and on certain structural properties of the circuit-under-test.

Figure 9:
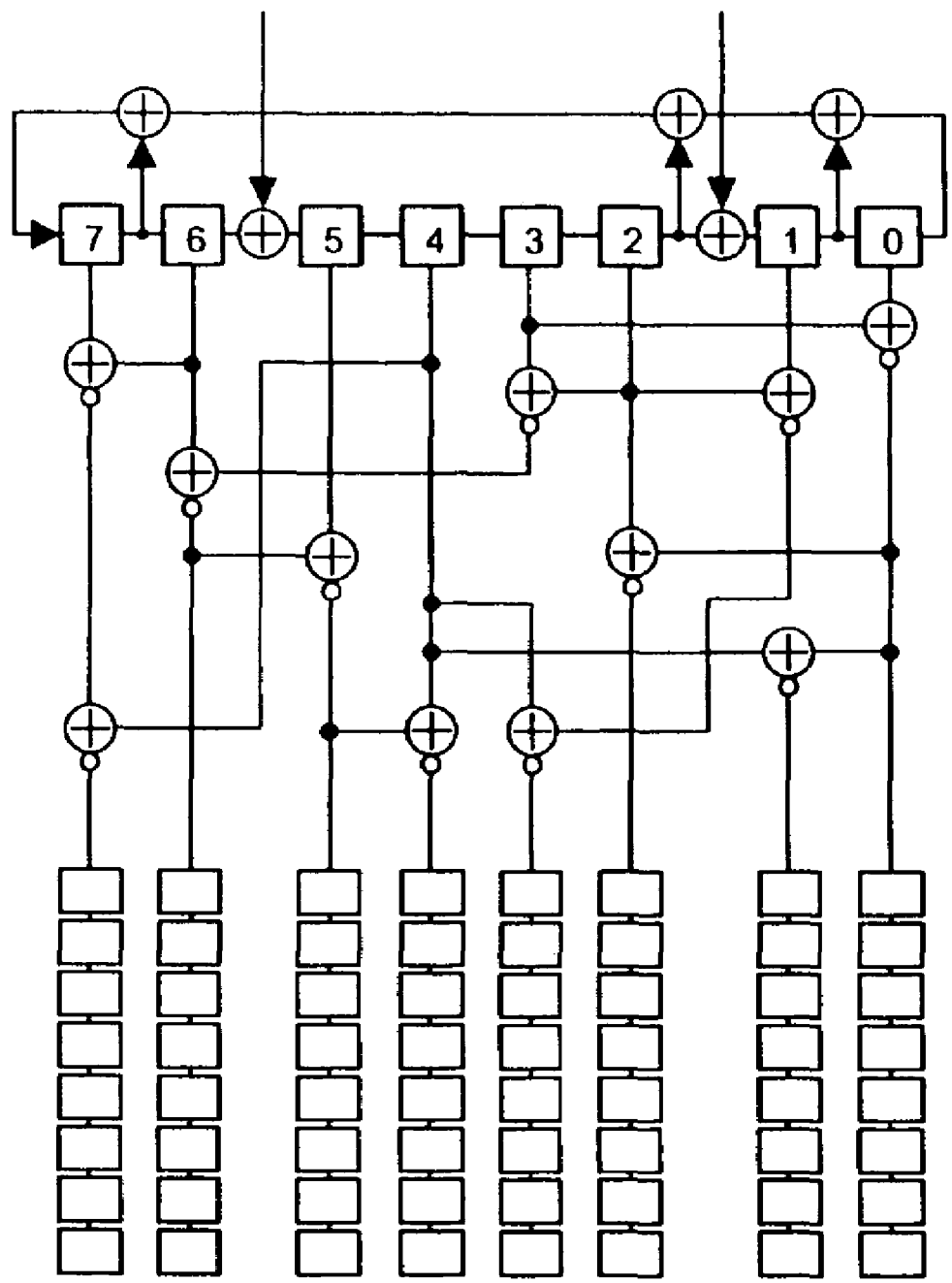
FIG. 9 illustrates an alternative embodiment of a phase shifter.

FIG. 9 illustrates an alternative embodiment of a phase shifter 50, constructed with an array of XNOR gates rather than XOR gates. Phase shifters can be constructed with combinations of XNOR and XOR gates as well.

Figure 10:
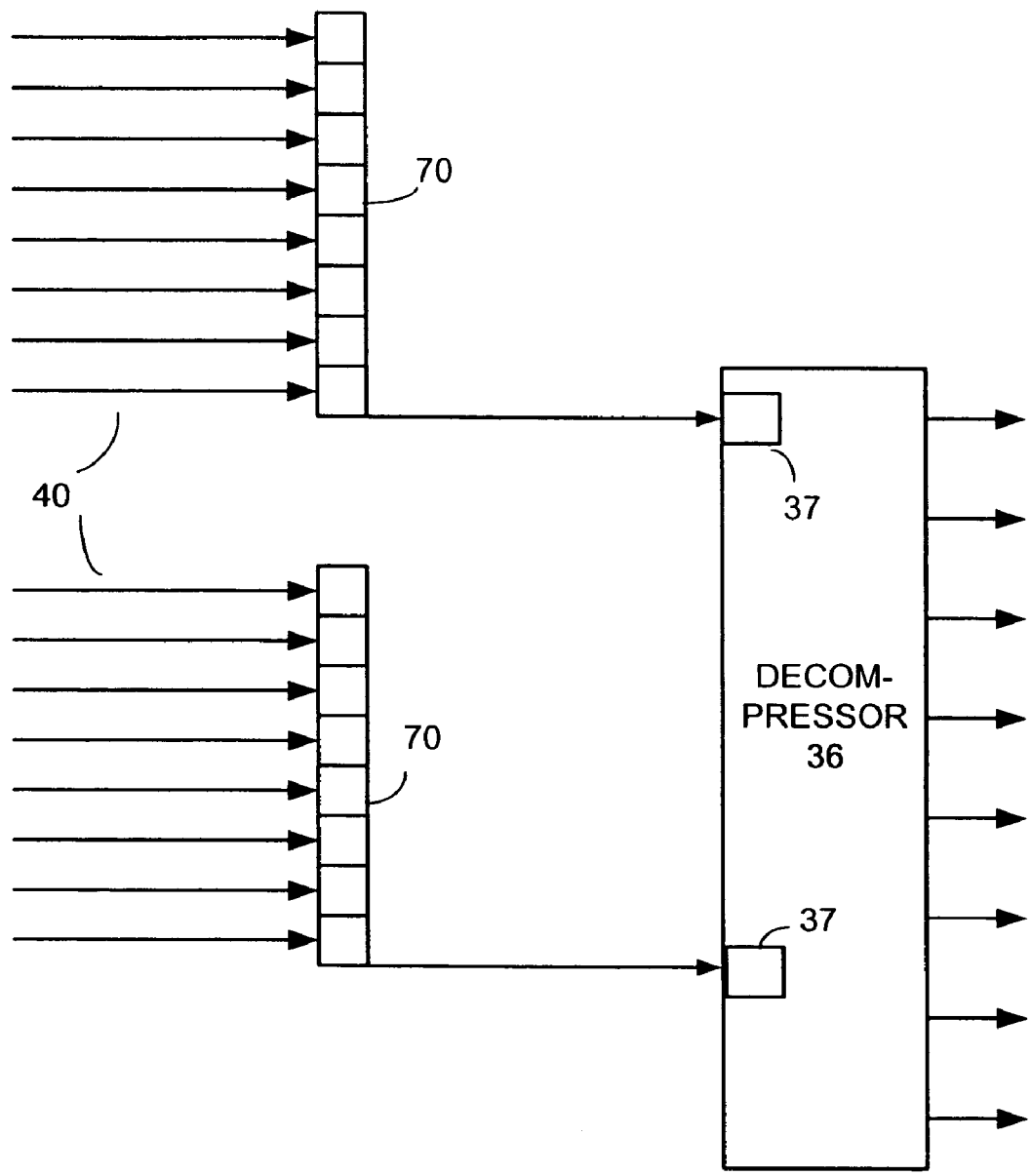
FIG. 10 illustrates the use of parallel-to-serial conversion for applying a compressed test pattern to the decompressor/PRPG.

FIG. 10 illustrates the use of parallel-to-serial conversion for applying a compressed test pattern to the decompressor. If the input channels 37 of the decompressor/PRPG 36 are fewer in number than the number of scan channels 40 of the tester 21, it can be advantageous to provide a parallel-to-serial converter such as registers 70 at the input to the decompressor. The registers 70 are clocked such that their contents are shifted out before the next set of bits is applied to the register from the tester 21. The continuous flow of the test patterns is thus preserved.

The process of decompressing a deterministic test pattern will now be described in more detail, with reference to FIG. 3. The LFSM 46 starts its operation from an initial all-zero state provided by a reset signal on line 39 by tester 21. Assuming an n-bit LFSM and m input injectors, [n/m] clock cycles may be used to initialize the LFSM before it starts generating bits corresponding to the actual test patterns. After initialization of the LFSM and assuming the appropriate system clocks are running at the same rate, a new bit is loaded in parallel into each scan chain 26 every clock cycle via the phase shifter 50. At this time, the circuit-under-test 24 is operated in the scan mode, so that the decompressed test pattern fills the scan chains 26 with 0s and 1s (and shifts out any previous test response stored there). A small number of bit positions in the scan chains, therefore, get deterministically specified values while the remaining positions are filled with random bits generated by the LFSM. The number of clock cycles for which a test pattern is shifted is determined by the length of the longest scan chain within the circuit, the number being at least as great as the number of cells in the longest scan chain. A scan-shift signal is therefore held high for all the scan chains until the longest scan chain gets the entire test pattern. The shorter scan chains in the circuit are left justified so that the first few bits that are shifted are overwritten without any loss of information.

Patterns from the LFSM may be linearly dependent. In other words, it is possible to determine various bit positions within the two-dimensional structure of multiple scan chains that are significantly correlated. This causes testability problems, as it is often not possible to provide the necessary stimulus for fault excitation to the gates driven by positions that have some form of dependency between them. Consequently, the phase shifter 50 (such as an array of XOR gates or XNOR gates) may be employed at the taps (outputs) of the LFSM to reduce linear dependencies between various bit positions within the scan chains. The XOR logic can be two-level or multi-level depending on the size of the XOR gates. Every scan chain in the CUT 24 is driven by signals that are obtained by XOR-ing a subset of taps 48 from the LFSM. These taps are determined so that the encoding efficiency of the test cubes is still preserved. In addition, the taps are selected in a manner so that all memory cells in the LFSM have approximately equal number of fan-out signals and the propagation delays are suitably optimized. Once a decompressed test pattern is completely loaded into the scan chains during test mode, the CUT 24 is switched to the normal mode of operation. The CUT then performs its normal operation under the stimulus provided by the test pattern in the scan chains. The test response of the CUT is captured in the scan chains. During the capture the LFSM is reset to the all-zero state before a new initialization cycle begins for loading the next test pattern.

Having illustrated and described the principles of the invention in exemplary embodiments, it should be apparent to those skilled in the art that the illustrative embodiments can be modified in arrangement and detail without departing from such principles. For example, the order of steps in the various methods can be varied. In view of the many possible embodiments to which the principles of the invention may be applied, it should be understood that the illustrative embodiment is intended to teach these principles and is not intended to be a limitation on the scope of the invention. We therefore claim as our invention all that comes within the scope and spirit of the following claims and their equivalents.

We claim:

1. A method for applying test patterns to scan chains in a circuit-under-test, comprising:
    operating a PRPG/decompressor in a pseudo-random mode to produce and apply pseudo-random test patterns to the scan chains of the circuit-under-test;
    capturing pseudo-random test pattern responses in the scan chains of the circuit-under-test;
    loading the pseudo-random test pattern responses into a compressor of the circuit-under-test;
    operating the PRPG/decompressor in a deterministic mode to decompress compressed deterministic test patterns and to substantially concurrently apply the decompressed deterministic test patterns to the scan chains of the circuit-under-test,
    capturing deterministic test pattern responses in the scan chains of the circuit-under-test; and
    loading the deterministic test pattern responses into the compressor of the circuit-under-test.

2. The method of claim 1, wherein the compressor comprises one or more spatial compactors.

3. The method of claim 1, wherein the compressor comprises one or more multiple input signature registers (MISRs).

4. The method of claim 1, wherein the compressor is reset when the PRPG/decompressor is switched between the deterministic mode and the pseudo-random mode.

5. The method of claim 1, wherein the compressor produces a single signature associated with at least one pseudo-random test result and at least one deterministic test result.

6. The method of claim 1, wherein the compressor produces a first signature associated with at least one pseudo-random test result and a second signature associated with at least one deterministic test result.

7. An apparatus for applying test patterns to scan chains in a circuit-under-test, comprising:
    a decompressor/PRPG, the decompressor/PRPG comprising a linear finite state machine and a phase shifter coupled to outputs of the linear finite state machine; and
    control circuitry coupled to the decompressor/PRPG and configured to selectively operate the decompressor/PRPG in a pseudo-random phase of operation and a deterministic phase of operation,
    wherein the decompressor/PRPG generates pseudo-random test patterns during the pseudo-random phase of operation and decompresses compressed deterministic test patterns during the deterministic phase of operation.

8. The circuit of claim 7, wherein the control circuitry comprises a BIST controller and one or more AND gates.

9. The circuit of claim 7, further comprising a compressor configured to compress test pattern responses of the circuit-under-test, the compressor being coupled to and resetable by the control circuitry.

10. The circuit of claim 7, wherein the control circuitry is coupled to an external tester.

11. The circuit of claim 7, wherein the decompressor/PRPG is coupled to an external tester and configured to receive compressed deterministic test patterns from the external tester during the deterministic phase of operation.

12. The circuit of claim 11, configured to decompress the compressed deterministic test patterns into decompressed deterministic test patterns as the compressed deterministic test patterns are being received from the external tester during the deterministic phase of operation.

* * * * *

UNITED STATES PATENT AND TRADEMARK OFFICE
CERTIFICATE OF CORRECTION

PATENT NO. : 7,093,175 B2
APPLICATION NO. : 10/736966
DATED : August 15, 2006
INVENTOR(S) : Rajski et al.

It is certified that error appears in the above-identified patent and that said Letters Patent is hereby corrected as shown below:

Title Page, Item (56) In the References Cited:

Under the heading "U.S. Patent Documents" add the following references:
-- 6,272,653    01/2001        Amstutz
   6,308,291    10/2001        Kock et al. --

Title Page, Item (56) In Other Publications add the following references:
--Aitken et al., "A Diagnosis Method Using Pseudo-Random Vectors Without Intermediate Signatures," *Proc. Iccad*, pp. 574-577 (1989).

Bardell et al., Built-in Test for VLSI Pseudorandom Techniques, Chapter 4, "Test Response Compression Techniques," John Wiley & Sons, Inc., pp. 89-108 (1987).

Benowitz et al., "An Advanced Fault Isolation System for Digital Logic," *IEEE Transactions on Computers*, Vol. C-24, No. 5, pp. 489-497 (May 1975).

Chakrabarty et al., "Optimal Zero-Aliasing Space Compaction of Test Responses," *IEEE Transactions on Computers*, Vol. 47, No. 11, pp. 1171-1187 (November 1998).

Chakrabarty, "Zero-Aliasing Space Compaction Using Linear Compactors with Bounded Overhead," *IEEE Transactions on Computer-Aided Design of Integrated Circuits and Systems*, Vol. 17, No. 5, pp. 452-457 (May 1998).

Ghosh-Dastidar et al., "Fault Diagnosis in Scan-Based BIST Using Both Time and Space Information," *Proc. ITC*, pp. 95-102 (September 1999).

Karpovsky et al., "Board-Level Diagnosis by Signature Analysis," *Proc. ITC*, pp. 47-53 (1988).

Signed and Sealed this
Sixteenth Day of April, 2013

Teresa Stanek Rea
*Acting Director of the United States Patent and Trademark Office*

CERTIFICATE OF CORRECTION (continued)
U.S. Pat. No. 7,093,175 B2

Karpovsky et al., "Design of Self-Diagnostic Boards by Multiple Signature Analysis," *IEEE Transactions on Computers*, Vol. 42, No. 9, pp. 1035-1044 (September 1993).

Kundu, "On Diagnosis of Faults in a Scan-Chain," *Proc. VLSI Test Symp.*, pp. 303-308 (1993).

Narayanan et al., "An Efficient Scheme to Diagnose Scan Chains," *Proc. ITC*, pp. 704-713 (1997).

Rajski et al., Arithmetic Built-In Self-Test for Embedded Systems, Chapter 3, "Test Response Compaction," and Chapter 4, "Fault Diagnosis," Prentice Hall PTR, pp. 87-133 (1998).

Rajski et al., "Diagnosis of Scan Cells in BIST Environment," *IEEE Transactions on Computers*, Vol. 48, No. 7, pp. 724-731 (July 1999).

Saluja et al., "Testing Computer Hardware through Data Compression in Space and Time," *Proc. ITC*, pp. 83-88 (1983).

Wu et al., "Scan-Based BIST Fault Diagnosis," *IEEE Transactions on Computer-Aided Design of Integrated Circuits and Systems*, Vol. 18, No. 2, pp. 203-211 (February 1999).--.